United States Patent
Suzuki et al.

(10) Patent No.: US 11,848,328 B2
(45) Date of Patent: Dec. 19, 2023

(54) SEMICONDUCTOR DEVICE HAVING STI REGIONS

(71) Applicant: MICRON TECHNOLOGY, INC., Boise, ID (US)

(72) Inventors: Ryota Suzuki, Sagamihara (JP); Makoto Sato, Sagamihara (JP); Hirokazu Matsumoto, Hachioji (JP); Kyoka Egami, Yokohama (JP)

(73) Assignee: Micron Technology, Inc., Boise, ID (US)

( * ) Notice: Subject to any disclaimer, the term of this patent is extended or adjusted under 35 U.S.C. 154(b) by 58 days.

(21) Appl. No.: 17/544,788

(22) Filed: Dec. 7, 2021

(65) Prior Publication Data
US 2023/0178548 A1 Jun. 8, 2023

(51) Int. Cl.
*H01L 27/092* (2006.01)
*H01L 21/8238* (2006.01)
*H01L 21/762* (2006.01)
*H01L 29/06* (2006.01)

(52) U.S. Cl.
CPC ...... *H01L 27/092* (2013.01); *H01L 21/76224* (2013.01); *H01L 21/8238* (2013.01); *H01L 29/0649* (2013.01)

(58) Field of Classification Search
CPC ............ H01L 27/092; H01L 21/76224; H01L 21/8238; H01L 21/823842; H01L 21/823878; H01L 29/0649
See application file for complete search history.

(56) References Cited

U.S. PATENT DOCUMENTS

| | | | |
|---|---|---|---|
| 2007/0020858 A1* | 1/2007 | Yang | H01L 27/0203 257/E21.619 |
| 2008/0210980 A1* | 9/2008 | Disney | H01L 21/823892 257/E21.612 |
| 2012/0261738 A1* | 10/2012 | Do | H01L 21/823828 257/315 |
| 2012/0299114 A1* | 11/2012 | Otake | H01L 29/1004 257/370 |
| 2023/0010934 A1* | 1/2023 | Singh | H01L 27/1207 |

* cited by examiner

*Primary Examiner* — Dao H Nguyen
(74) *Attorney, Agent, or Firm* — Dorsey & Whitney LLP

(57) ABSTRACT

Disclosed herein is an apparatus that includes: a semiconductor substrate including first and second STI regions arranged in a first direction, a first diffusion region having a first conductivity type surrounded by the first STI region, a second diffusion region having a second conductivity type surrounded by the second STI region, and a third diffusion region extending in a second direction such that the third diffusion region is arranged between the first and second STI regions; a first gate electrode including a first polycrystalline silicon film covering a part of the first diffusion region to form a P-channel MOS transistor; a second gate electrode including a second polycrystalline silicon film covering a part of the second diffusion region to form an N-channel MOS transistor; and a third polycrystalline silicon film extending in the second direction such that the third polycrystalline silicon film covers the third diffusion region.

17 Claims, 5 Drawing Sheets

SEMICONDUCTOR DEVICE HAVING STI REGIONS

BACKGROUND

In a semiconductor device, an active region where a transistor is formed is surrounded by an STI region. The STI region is mainly made of silicon oxide. Therefore, there is a problem that oxygen contained in the STI region migrates into a gate insulating film to cause change of a threshold voltage of the transistor. This problem is significant especially when a High-k material is used for the gate insulating film.

DETAILED DESCRIPTION

Various embodiments of the present invention will be explained below in detail with reference to the accompanying drawings. The following detailed description refers to the accompanying drawings that show, by way of illustration, specific aspects, and embodiments in which the present invention may be practiced. These embodiments are described in sufficient detail to enable those skilled in the art to practice the present invention. Other embodiments may be utilized, and structural, logical, and electrical changes may be made without departing from the scope of the present invention. The various embodiments disclosed herein are not necessary mutually exclusive, as some disclosed embodiments can be combined with one or more other disclosed embodiments to form new embodiments.

Figure 1:
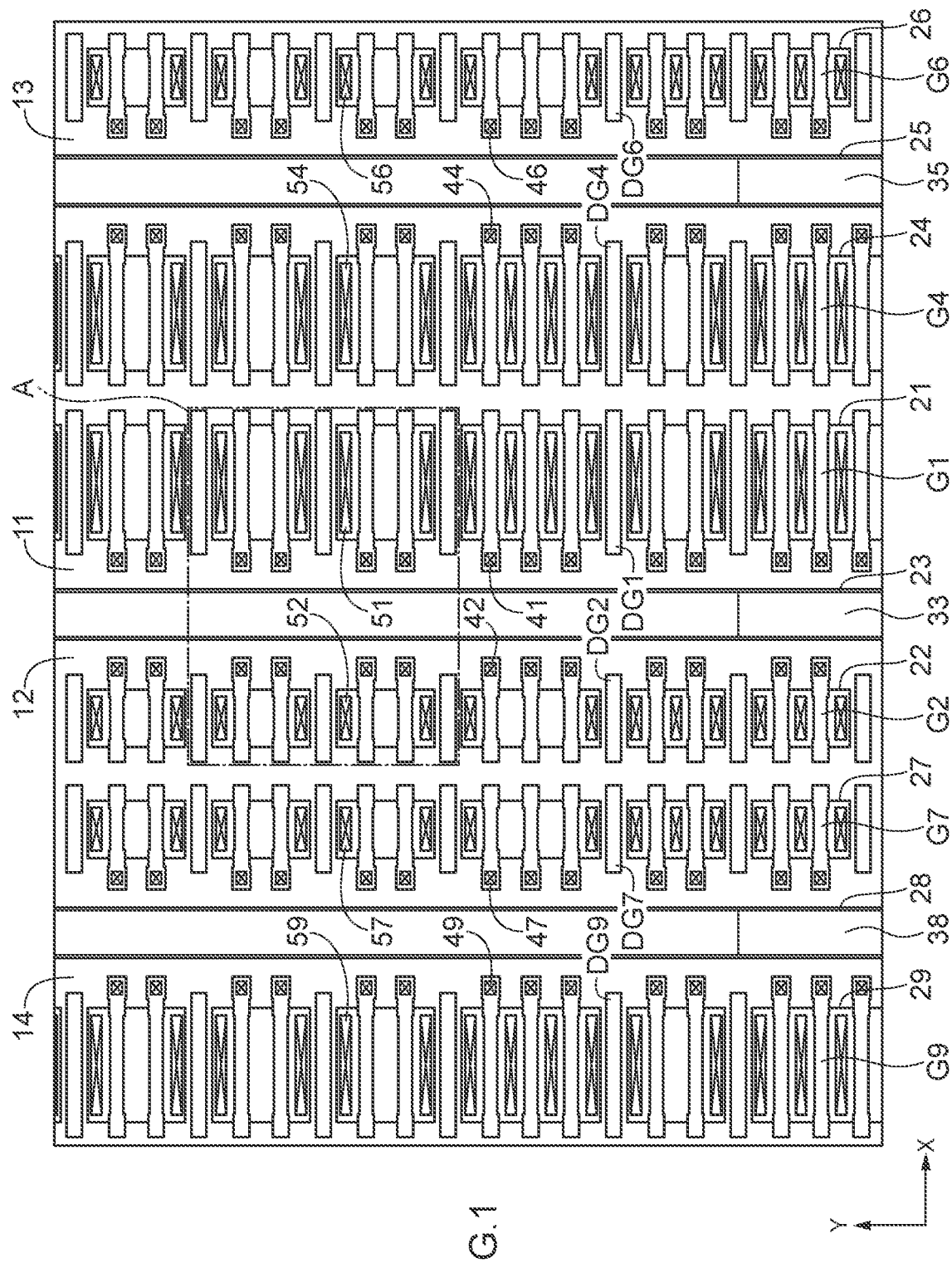
FIG. 1 is a schematic plan view showing a configuration of a semiconductor device according to the present disclosure.
Figure 2A:
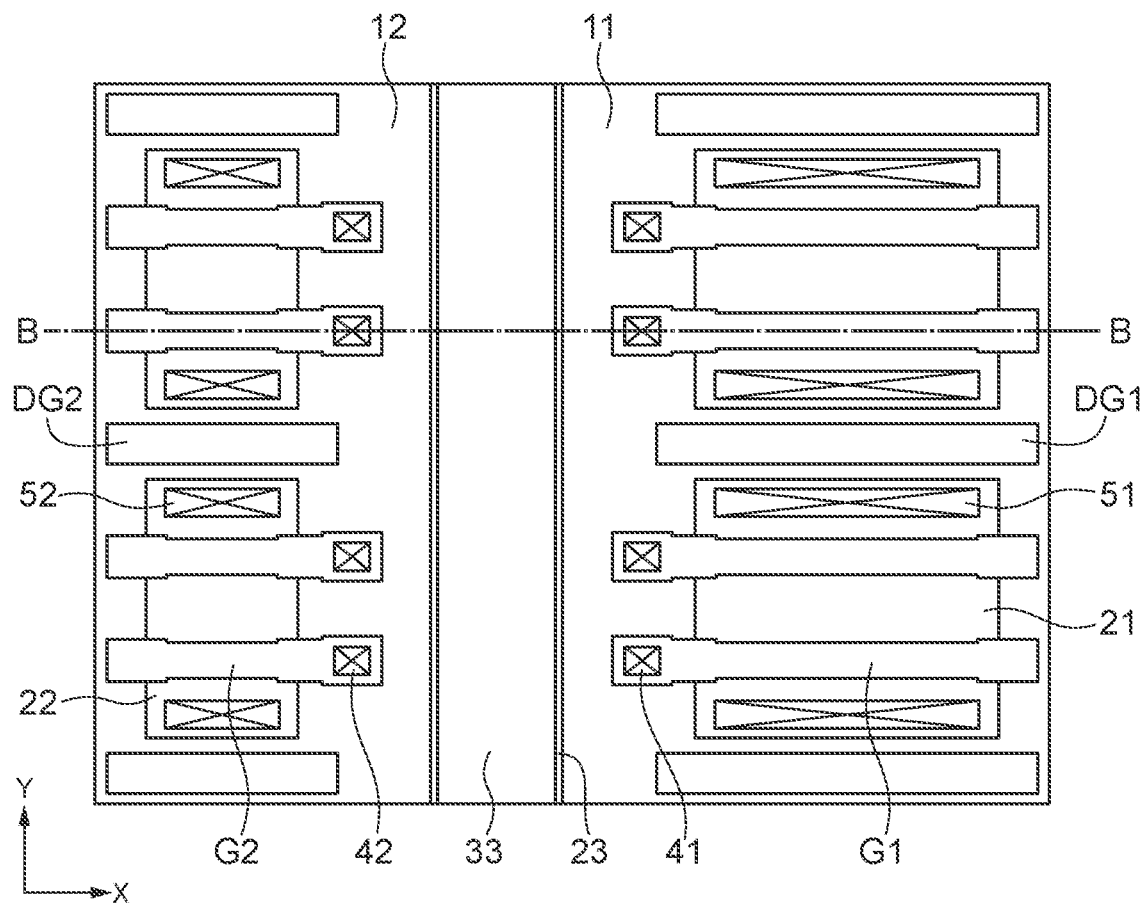
FIG. 2A is a schematic plan view showing a region A shown in FIG. 1 in an enlarged manner.
Figure 2B:
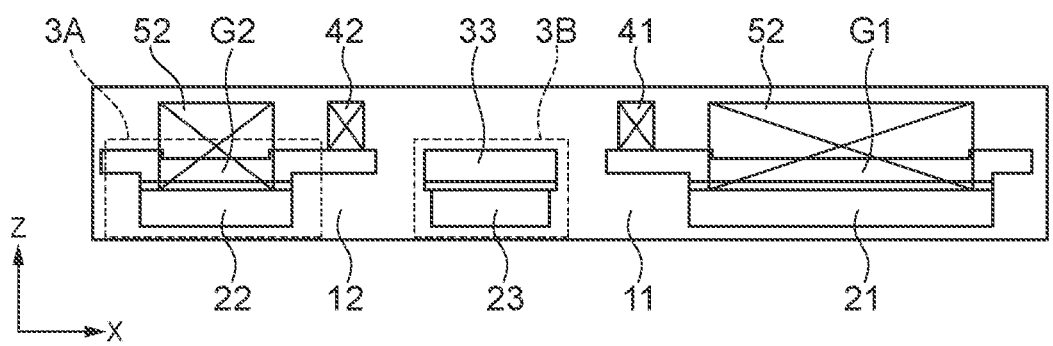
FIG. 2B is a schematic cross-sectional view taken along a line B-B in FIG. 2A.

FIG. 1 is a schematic plan view showing a configuration of a semiconductor device according to the present disclosure. The semiconductor device according to the present disclosure is a standard cell semiconductor device and, as shown in FIG. 1, includes STI regions 11 to 14 provided in a semiconductor substrate and a plurality of active regions respectively surrounded by the STI regions 11 to 14. The active regions are portions of the semiconductor substrate. FIG. 2A is an enlarged view of a region A shown in FIG. 1. FIG. 2B is a schematic cross-sectional view taken along a line B-B in FIG. 2A.

The active region surrounded by the STI region 11 includes P-type diffusion regions 21 and 24. The active region surrounded by the STI region 12 includes N-type diffusion regions 22 and 27. The active region surrounded by the STI region 13 includes an N-type diffusion region 26. The active region surrounded by the STI region 14 includes a P-type diffusion region 29. As for each of the P-type diffusion regions 21, 24, and 29 and the N-type diffusion regions 22, 26, and 27, multiple diffusion regions are arranged in the Y direction. Further, gate electrodes G1, G4, and G9 are provided on the P-type diffusion regions 21, 24, and 29, respectively, whereby a plurality of P-channel MOS transistors are formed. A region in each of the P-type diffusion regions 21, 24, and 29 not covered by the gate electrode G1, G4, or G9 is a source/drain region. Gate electrodes G2, G6, and G7 are provided on the N-type diffusion regions 22, 26, and 27, respectively, whereby a plurality of N-channel MOS transistors are formed. A region in each of the N-type diffusion regions 22, 26, and 27 not covered by the gate electrode G2, G6, or G7 is a source/drain region. A diffusion region 23 extending in the Y direction is arranged between the STI region 11 and the STI region 12. Accordingly, the diffusion region 23 is interposed between the P-type diffusion region 21 and the N-type diffusion region 22 that are adjacent to each other in the X direction. A diffusion region 25 extending in the Y direction is arranged between the STI region 11 and the STI region 13. Accordingly, the diffusion region 25 is interposed between the P-type diffusion region 24 and the N-type diffusion region 26 that are adjacent to each other in the X direction. A diffusion region 28 extending in the Y direction is arranged between the STI region 12 and the STI region 14. Accordingly, the diffusion region 28 is interposed between the P-type diffusion region 29 and the N-type diffusion region 27 that are adjacent to each other in the X direction.

The gate electrodes G1, G2, G4, G6, G7, and G9 are connected to an upper wiring layer (not shown) through via conductors 41, 42, 44, 46, 47, and 49, respectively. The source/drain regions of the P-type diffusion regions 21, 24, and 29 are connected to an upper wiring layer (not shown) through via conductors 51, 54, and 59, respectively. The source/drain regions of the N-type diffusion regions 22, 26, and 27 are connected to an upper wiring layer (not shown) through the via conductors 52, 56, and 57, respectively. Further, a dummy gate electrode DG1 is provided between the P-type diffusion regions 21 that are adjacent to each other in the Y direction. A dummy gate electrode DG4 is provided between the P-type diffusion regions 24 that are adjacent to each other in the Y direction. A dummy gate electrode DG9 is provided between the P-type diffusion regions 29 that are adjacent to each other in the Y direction. A dummy gate electrode DG2 is provided between the N-type diffusion regions 22 that are adjacent to each other in the Y direction. A dummy gate electrode DG6 is provided between the N-type diffusion regions 26 that are adjacent to each other in the Y direction. A dummy gate electrode DG7 is provided between the N-type diffusion regions 27 that are adjacent to each other in the Y direction.

The diffusion regions 23, 25, and 28 are dummy diffusion regions provided for reducing the volume of the STI regions and have a impurity concentration lower than the P-type diffusion regions 21, 24, and 29 and the N-type diffusion regions 22, 26, and 27. The conductive type of the diffusion regions 23, 25, and 28 may be P-type or N-type. The diffusion regions 23, 25, and 28 are respectively covered by conductive patterns 33, 35, and 38 that are extending in the Y direction. It is preferable that the diffusion regions 23, 25, and 28 are completely covered by conductive patterns 33, 35, and 38, respectively. In this case, each of the diffusion regions 23, 25, and 28 does not have a portion exposed from the associated conductive pattern 33, 35, or 38 in plan view.

Figure 3A:
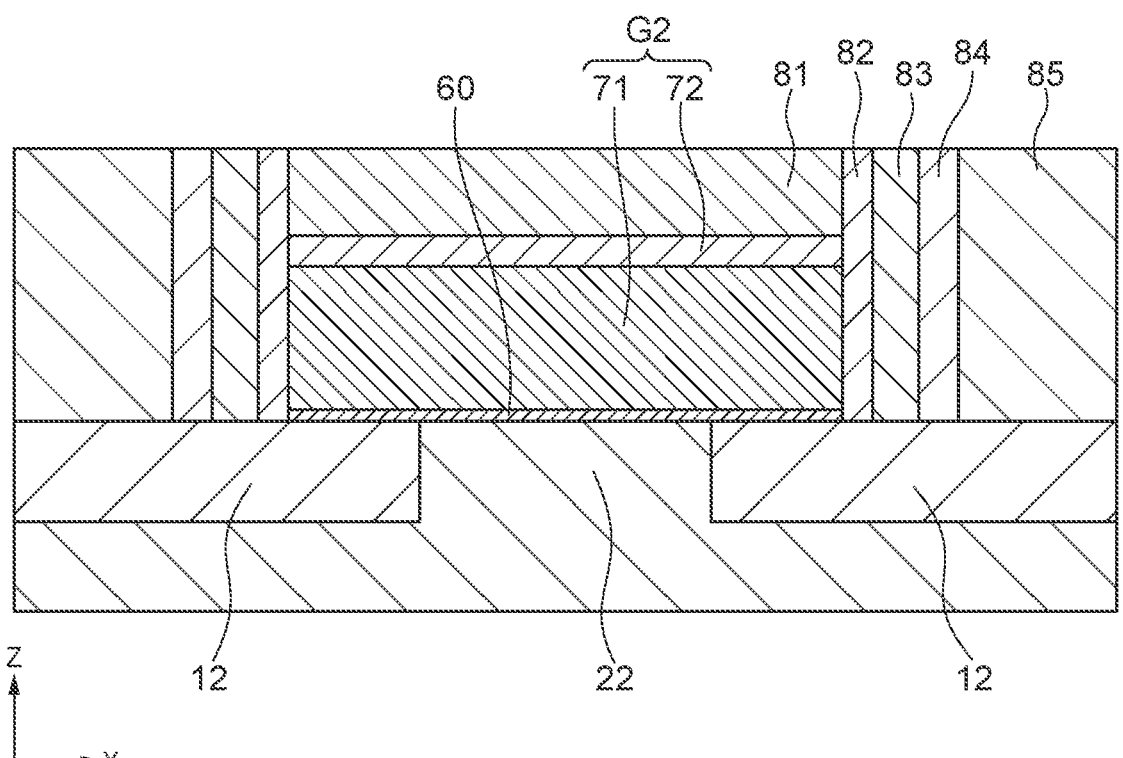
FIG. 3A is a schematic cross-sectional view showing a portion in FIG. 2B in more detail.
Figure 3B:
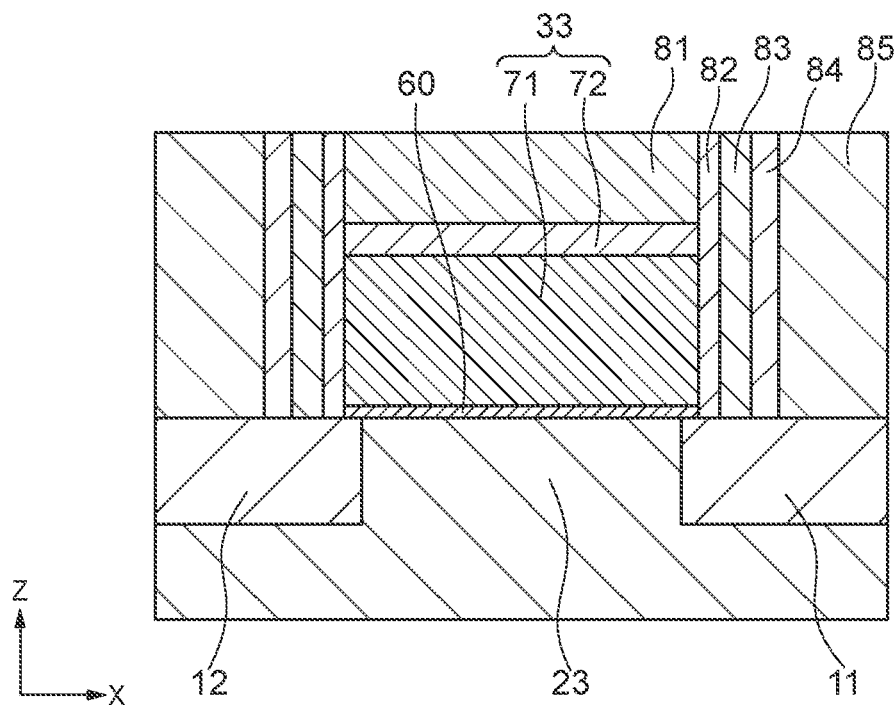
FIG. 3B is a schematic cross-sectional view showing another portion in FIG. 2B in more detail.

FIG. 3A is a schematic cross-sectional view showing a configuration in a region 3A shown in FIG. 2B in more detail. FIG. 3B is a schematic cross-sectional view showing a configuration in a region 3B shown in FIG. 2B in more detail. As shown in FIG. 3A, the gate electrode G2 has a structure in which a polycrystalline silicon film 71 and a metal film 72 are stacked in this order. The gate electrode G2 may be referred to as having a laminated structure. The structure of the gate electrode G2 is not specifically limited to any form and may be a stacked structure formed of polycrystalline silicon, metal such as Ti, W, or AL, its nitride, or its oxide. The gate electrode G1 may have the same structure as the gate electrode G2. The gate electrode G1 may be referred to having the same laminated structure as gate electrode G2. However, gate electrode G1 may be partly or entirely different in structure and/or material from the gate electrode G2. Similarly to the gate electrode G2, the conductive pattern 33 covering the diffusion region 23 also has the structure in which the polycrystalline silicon film 71 and the metal film 72 are stacked in this order. The conductive pattern 33 may be referred to as having the same laminated structure as gate electrode G2. However, it is not essential that the conductive pattern 33 has the same structure as the gate electrode G2. The conductive pattern 33 may have the same structure as the gate electrode G1, or may have a structure different from those of the gate electrodes G1 and G2 as long as ion implantation to the diffusion region 23 is prevented. In a case where the gate electrode G2 and the conductive pattern 33 have the same stacked structure as each other, they can be formed simultaneously. Insulating films 60 are provided between the diffusion region 21 and the gate electrode G1, between the diffusion region 22 and the gate electrode G2, and between the diffusion region 23 and the conductive pattern 33. Among those insulating films 60, the insulating films 60 provided between the diffusion region 21 and the gate electrode G1 and between the diffusion region 22 and the gate electrode G2 serve as gate insulating films. The gate insulating films 60 are made of a material having a high dielectric constant, and the dielectric constant of that material is higher than that of silicon oxide. For example, in some embodiments of the disclosure, the material of the gate insulating films 60 is hafnium oxide. However, other materials may be used for the insulating firms without departing from the scope of the disclosure. In this manner, the insulating films (gate insulating films) 60 covering the diffusion regions 21 and 22 and the insulating film 60 covering the diffusion region 23 have the same stacked structure as one another and can be formed simultaneously. The top surfaces of the gate electrodes G1 and G2 and the top surface of the conductive pattern 33 are covered by an insulating film 81 that is made of, for example, silicon nitride. Further, the side surfaces of the gate electrodes G1 and G2 and the side surface of the conductive pattern 33 are covered by spacer films 82 and 83 and a liner film 84. The liner film 84 is covered by an SOD film 85.

As described above, in a semiconductor device according to the present disclosure, the diffusion region 23, 25, or 28 extending in the Y direction is arranged between a P-type diffusion region and an N-type diffusion region, and therefore the volume of STI regions is reduced while a certain distance in the X direction between the P-type diffusion region and the N-type diffusion region is ensured. Accordingly, the migration amount of oxygen contained in the STI regions is reduced, and thus it is possible to prevent change of the threshold of a transistor even when the gate insulating film 60 is made of a material having a high dielectric constant. Further, since the diffusion regions 23, 25, and 28 are respectively covered by the conductive patterns 33, 35, and 38, ion implantation into the diffusion regions 23, 25, and 28 can be prevented as described later.

Figure 4:
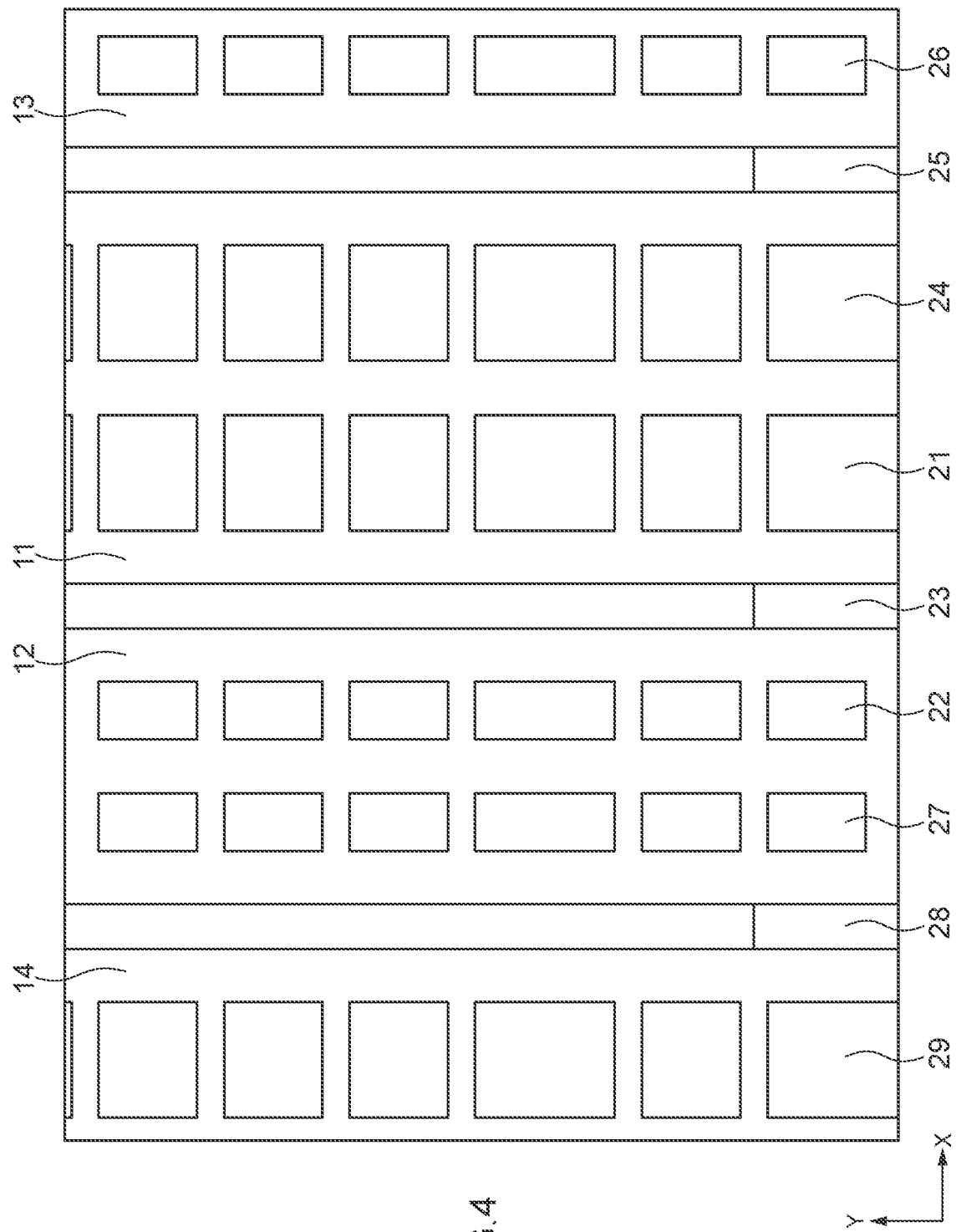
FIGS. 4, 5A, and 5B are schematic diagrams for explaining a manufacturing process of the semiconductor device according to the present disclosure.
Figure 5A:
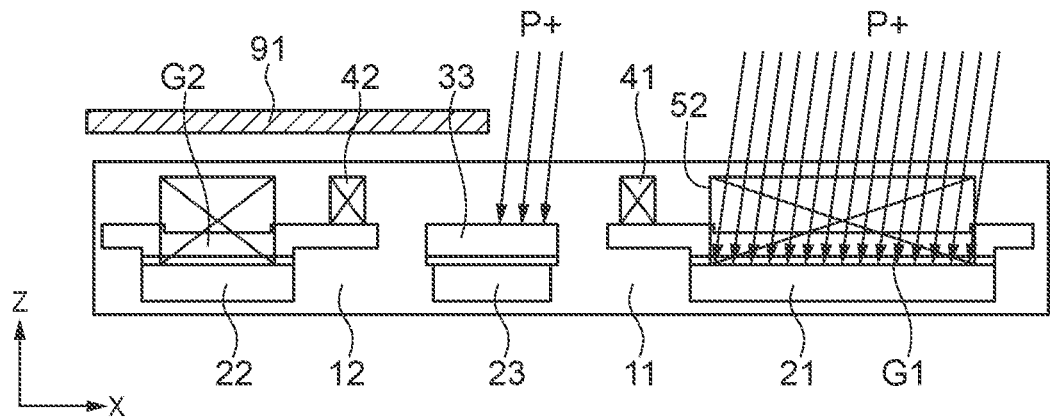
Figure 5B:
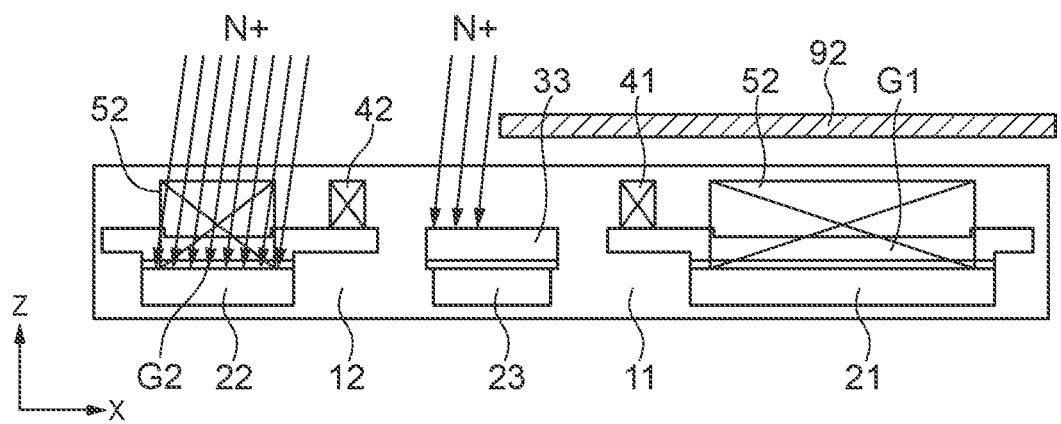

Next, a manufacturing process of the semiconductor device according to the present disclosure is described. First, the STI regions 11 to 14 are formed in a semiconductor substrate as shown in FIG. 4. Portions surrounded by the STI regions 11 to 14 in plan view are the diffusion regions 21, 22, 24, 26, 27, and 29. Further, the diffusion regions 23, 25, and 28 extending in the Y direction are formed between STI regions that are adjacent to each other in the X direction. Next, the insulating film 60 is formed, and thereafter the gate electrodes G1, G2, G4, G6, G7, and G9 and the conductive patterns 33, 35, and 38 are formed. Since the gate electrodes G1, G2, G4, G6, G7, and G9 and the conductive patterns 33, 35, and 38 are simultaneously formed, they have the same stacked structure as one another. Next, as shown in FIG. 5A, ion implantation of $P^+$-type dopant is performed while the diffusion regions 22, 26, and 27 are covered by a mask 91. Accordingly, $P^+$-type dopant is implanted into uncovered portions of the diffusion regions 21, 24, and 29 which are not covered by the gate electrodes G1, G4, and G9, so that P-type source/drain regions are formed. Consequently, P-channel MOS transistors are formed. At this time, the $P^+$-type dopant is not implanted into the diffusion regions 22, 26, and 27 because those regions are covered by the mask 91. Also for the diffusion regions 23, 25, and 28 extending in the Y direction, the $P^+$-type dopant is not implanted because those regions are entirely covered by the conductive patterns 33, 35, and 38. At this time, the mask 91 may cover a part of each of the diffusion regions 23, 25, and 28. Next, as shown in FIG. 5B, ion implantation of $N^+$-type dopant is performed while the diffusion regions 21, 24, and 29 are covered by a mask 92. With this process, the $N^+$-type dopant is implanted into uncovered portions of the diffusion regions 22, 26, and 27 which are not covered by the gate electrodes G2, G6, and G7, so that N-type source/drain regions are formed. Consequently, N-channel MOS transistors are formed. At this time, the $N^+$-type dopant is not implanted into the diffusion regions 21, 24, and 29 because those regions are covered by the mask 92. Also for the diffusion regions 23, 25, and 28 extending in the Y direction, the $N^+$-type dopant is not implanted because those regions are entirely covered by the conductive patterns 33, 35, and 38. At this time, the mask 92 may cover other portions of the diffusion regions 23, 25, and 28.

With the above processes, the P-channel MOS transistors are formed in the diffusion regions 21, 24, and 29, and the N-channel MOS transistors are formed in the diffusion regions 22, 26, and 27. Meanwhile, since both the $P^+$-type dopant and $N^+$-type dopant are not implanted into the diffusion regions 23, 25, and 28 extending in the Y direction, the impurity concentrations of those regions are kept low. Therefore, there is no possibility of occurrence of latch-up by a PN junction, unlike a case where the $P^+$-type dopant is implanted into portions of the diffusion regions 23, 25, and 28 on the side close to the P-type diffusion regions 21, 24, and 29 and the $N^+$-type dopant is implanted to portions of the diffusion regions 23, 25, and 28 on the side close to the N-type diffusion regions 22, 26, and 27.

Although this invention has been disclosed in the context of certain preferred embodiments and examples, it will be understood by those skilled in the art that the inventions extend beyond the specifically disclosed embodiments to other alternative embodiments and/or uses of the inventions and obvious modifications and equivalents thereof. In addition, other modifications which are within the scope of this invention will be readily apparent to those of skill in the art based on this disclosure. It is also contemplated that various combination or sub-combination of the specific features and aspects of the embodiments may be made and still fall within the scope of the inventions. It should be understood that various features and aspects of the disclosed embodiments can be combined with or substituted for one another in order to form varying mode of the disclosed invention. Thus, it is intended that the scope of at least some of the present invention herein disclosed should not be limited by the particular disclosed embodiments described above.

The invention claimed is:

1. An apparatus comprising:
a semiconductor substrate including first and second STI regions arranged in a first direction, a first diffusion region having a first conductivity type surrounded by the first STI region, a second diffusion region having a second conductivity type different from the first conductivity type surrounded by the second STI region, and a third diffusion region extending in a second direction perpendicular to the first direction such that the third diffusion region is arranged between the first and second STI regions;
a first gate electrode including a first polycrystalline silicon film covering a part of the first diffusion region to form a P-channel MOS transistor;
a second gate electrode including a second polycrystalline silicon film covering a part of the second diffusion region to form an N-channel MOS transistor; and
a third polycrystalline silicon film extending in the second direction such that the third polycrystalline silicon film covers the third diffusion region.

2. The apparatus of claim 1, wherein an impurity concentration of the third diffusion region is lower than those of the first and second diffusion regions.

3. The apparatus of claim 1,
wherein the first gate electrode further includes a first metal film formed on the first polycrystalline silicon film,
wherein the second gate electrode further includes a second metal film formed on the second polycrystalline silicon film, and
wherein the apparatus further comprises a third metal film formed on the third polycrystalline silicon film.

4. The apparatus of claim 3, further comprising:
a first insulating film arranged between the first diffusion region and the first gate electrode;
a second insulating film arranged between the second diffusion region and second gate electrode; and
a third insulating film arranged between the third diffusion region and the third polycrystalline silicon film.

5. The apparatus of claim 4, wherein the first, second, and third insulating films comprise the same insulating material as one another.

6. The apparatus of claim 5, wherein each of the first, second, and third insulating films includes an insulating material having a dielectric constant higher than that of a silicon oxide.

7. The apparatus of claim 6, wherein the insulating material comprises a hafnium oxide.

8. An apparatus comprising:
a semiconductor substrate including a plurality of first diffusion regions having a first conductivity type arranged in a first direction, a plurality of second diffusion regions having a second conductivity type different from the first conductivity type arranged in the first direction, and a third diffusion region extending in the first direction such that the third diffusion region is arranged between the plurality of first diffusion regions and the plurality of second diffusion regions in a second direction perpendicular to the first direction;
a first STI region arranged between the plurality of first diffusion regions and the third diffusion region;
a second STI region arranged between the plurality of second diffusion regions and the third diffusion region;
a plurality of first gate electrodes covering a part of an associated one of the plurality of first diffusion regions to form a plurality of P-channel MOS transistors;
a plurality of second gate electrodes covering a part of an associated one of the plurality of second diffusion regions to form a plurality of N-channel MOS transistors; and
a first conductive pattern extending in the first direction such that the first conductive pattern covers the third diffusion region, the first conductive pattern having the same laminated structure as each of the first and second gate electrodes.

9. The apparatus of claim 8, wherein the first conductive pattern includes a polycrystalline silicon film.

10. The apparatus of claim 9, wherein the first conductive pattern further includes a metal film formed on the polycrystalline silicon film.

11. The apparatus of claim 10, further comprising:
a plurality of first insulating films each arranged between an associated one of the first diffusion regions and an associated one of the first gate electrodes;
a plurality of second insulating films each arranged between an associated one of the second diffusion regions and an associated one of the second gate electrodes; and
a third insulating film arranged between the third diffusion region and the first conductive pattern,
wherein each of the first, second, and third insulating films includes an insulating material having a dielectric constant higher than that of a silicon oxide.

12. The apparatus of claim 11, wherein the insulating material comprises a hafnium oxide.

13. The apparatus of claim 8, wherein an impurity concentration of the third diffusion region is lower than those of the first and second diffusion regions.

14. The apparatus of claim 8,
wherein the semiconductor substrate further includes a plurality of fourth diffusion regions having the first conductivity type arranged in the first direction and a fifth diffusion region extending in the first direction such that the plurality of fourth diffusion regions are arranged between the plurality of first diffusion regions and the fifth diffusion region in the second direction,
wherein the first STI region is further arranged between the plurality of first diffusion regions and the plurality of fourth diffusion regions and between the plurality of fourth diffusion regions and the fifth diffusion region, and
wherein the apparatus further comprises a second conductive pattern extending in the first direction such that the second conductive pattern covers the fifth diffusion region, the second conductive pattern having the same laminated structure as each of the first and second gate electrodes.

15. The apparatus of claim 14,
wherein the semiconductor substrate further includes a plurality of sixth diffusion regions having the second conductivity type arranged in the first direction, and
wherein the fifth diffusion region is arranged between the plurality of fourth diffusion regions and the plurality of sixth diffusion regions in the second direction.

16. The apparatus of claim 15,
  wherein the semiconductor substrate further includes a plurality of seventh diffusion regions having the second conductivity type arranged in the first direction and an eighth diffusion region extending in the first direction such that the plurality of seventh diffusion regions are arranged between the plurality of second diffusion regions and the eighth diffusion region in the second direction,
  wherein the second STI region is further arranged between the plurality of second diffusion regions and the plurality of seventh diffusion regions and between the plurality of seventh diffusion regions and the eighth diffusion region, and
  wherein the apparatus further comprises a third conductive pattern extending in the first direction such that the third conductive pattern covers the eighth diffusion region, the third conductive pattern having the same laminated structure as each of the first and second gate electrodes.

17. The apparatus of claim 16,
  wherein the semiconductor substrate further includes a plurality of ninth diffusion regions having the first conductivity type arranged in the first direction, and
  wherein the eighth diffusion region is arranged between the plurality of seventh diffusion regions and the plurality of ninth diffusion regions in the second direction.

* * * * *